(12) United States Patent
Kagaya

(10) Patent No.: US 12,331,403 B2
(45) Date of Patent: Jun. 17, 2025

(54) SUBSTRATE PROCESSING METHOD AND SUBSTRATE PROCESSING DEVICE

(71) Applicant: Tokyo Electron Limited, Tokyo (JP)

(72) Inventor: Munehito Kagaya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 416 days.

(21) Appl. No.: 17/754,373

(22) PCT Filed: Sep. 29, 2020

(86) PCT No.: PCT/JP2020/036939
§ 371 (c)(1),
(2) Date: Mar. 31, 2022

(87) PCT Pub. No.: WO2021/070682
PCT Pub. Date: Apr. 15, 2021

(65) Prior Publication Data
US 2022/0333249 A1 Oct. 20, 2022

(30) Foreign Application Priority Data
Oct. 8, 2019 (JP) .................... 2019-185446

(51) Int. Cl.
| | |
|---|---|
| H01L 21/306 | (2006.01) |
| C23C 16/34 | (2006.01) |
| C23C 16/40 | (2006.01) |
| C23C 16/505 | (2006.01) |
| C23C 16/52 | (2006.01) |
| C23C 16/56 | (2006.01) |
| H01J 37/32 | (2006.01) |

(52) U.S. Cl.
CPC ............ *C23C 16/56* (2013.01); *C23C 16/345* (2013.01); *C23C 16/402* (2013.01); *C23C 16/505* (2013.01); *C23C 16/52* (2013.01); *H01J 37/32422* (2013.01); *H01J 2237/334* (2013.01)

(58) Field of Classification Search
CPC ..................... H01L 21/3065; H01L 21/30655
See application file for complete search history.

(56) References Cited

U.S. PATENT DOCUMENTS

| | | | |
|---|---|---|---|
| 2013/0005140 A1* | 1/2013 | Jeng | C23C 16/045 438/653 |
| 2017/0076955 A1* | 3/2017 | Hudson | H01J 37/32009 |
| 2018/0301460 A1 | 10/2018 | Yoo et al. | |

FOREIGN PATENT DOCUMENTS

| | | |
|---|---|---|
| JP | 2012-199306 A | 10/2012 |
| JP | 2014-532304 A | 12/2014 |
| JP | 2018-026524 A | 2/2018 |
| KR | 10-2019-0014471 A | 2/2019 |

\* cited by examiner

*Primary Examiner* — Thomas T Pham
(74) *Attorney, Agent, or Firm* — Armstrong Teasdale LLP

(57) ABSTRACT

A substrate processing method and a substrate processing device capable of obtaining good embedding characteristics are provided. The substrate processing method includes: embedding a first insulating film in a recess of a substrate by repeating forming an adsorption layer on the substrate by supplying a silicon-containing gas and causing plasma of a reaction gas to react with the adsorption layer by generating the plasma of the reaction gas; and etching the first insulating film by generating plasma of an etching gas, wherein a shape of the first insulating film embedded in the recess after etching is controlled by controlling plasma generation parameters in the causing the plasma to react with the adsorption layer.

12 Claims, 17 Drawing Sheets

Repeating for a predetermined number of cycles

SUBSTRATE PROCESSING METHOD AND SUBSTRATE PROCESSING DEVICE

CROSS-REFERENCE TO RELATED APPLICATIONS

The present application is a U.S. National Stage Entry of International Patent Application No. PCT/JP2020/036939, filed Sep. 29, 2020, which claims the benefit of priority to Japanese Patent Application No. 2019-185446, filed Oct. 8, 2019, each of which is hereby incorporated herein by reference in its entirety.

TECHNICAL FIELD

The present disclosure relates to substrate processing method and a substrate processing device.

BACKGROUND

For example, a substrate processing device for embedding a film in a recess such as a trench or the like formed on a substrate is known.

Patent Document 1 discloses a film-forming method that includes a film formation of forming a silicon oxide film on a substrate and an etching of etching the silicon oxide film formed in the film formation, wherein the film formation and the etching are repeated alternately.

PRIOR ART DOCUMENT

Patent Document

Patent Document 1: Japanese laid-open publication No. 2012-199306

In one aspect, the present disclosure provides a substrate processing method and a substrate processing device capable of obtaining good embedding characteristics.

SUMMARY

In order to solve the above problem, according to one embodiment, there is provided a substrate processing method, including: embedding a first insulating film in a recess of a substrate by repeating forming an adsorption layer on the substrate by supplying a silicon-containing gas and causing plasma of a reaction gas to react with the adsorption layer by generating the plasma of the reaction gas; and etching the first insulating film by generating plasma of an etching gas, wherein a shape of the first insulating film embedded in the recess after etching is controlled by controlling plasma generation parameters in the causing the plasma to react with the adsorption layer.

According to one aspect, it is possible to provide a substrate processing method and a substrate processing device capable of obtaining good embedding characteristics.

DETAILED DESCRIPTION

Figure 1:
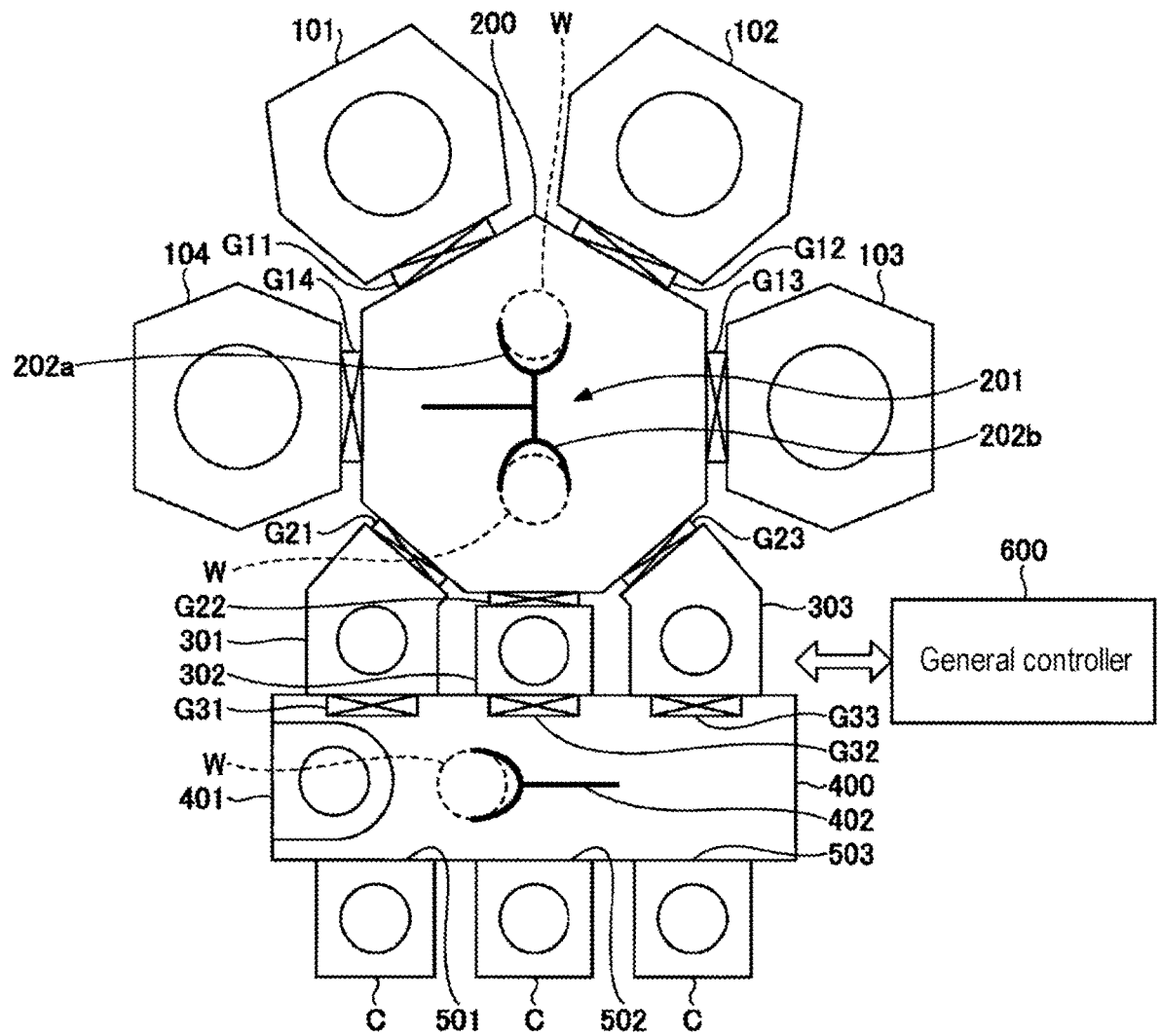
FIG. 1 is a schematic diagram showing a configuration example of a substrate processing system.

Hereinafter, embodiments for carrying out the present disclosure will be described with reference to the drawings. In each drawing, the same components may be designated by the same reference numerals and duplicate descriptions thereof may be omitted.

[Substrate Processing System]

The substrate processing system according to the present embodiment will be described with reference to FIG. 1. FIG. 1 is a schematic diagram showing a configuration example of the substrate processing system.

As shown in FIG. 1, the substrate processing system includes processing devices 101 to 104, a vacuum transfer chamber 200, load lock chambers 301 to 303, an air transfer chamber 400, load ports 501 to 503, and a general controller 600.

The processing devices 101 to 104 are connected to the vacuum transfer chamber 200 via gate valves G11 to G14, respectively. The inside of the processing devices 101 to 104 is depressurized to a predetermined vacuum atmosphere, and the wafer W is subject to a desired process inside each of the processing devices 101 to 104. In one embodiment, the processing device 101 is a device for forming a SiN film on the wafer W. The processing device 102 is a device for etching the SiN film formed by the processing device 101. The processing device 103 is a device for forming a SiN film on the wafer W etched by the processing device 102. The processing device 104 may be the same device as any of the processing devices 101 to 103 or may be a device for performing other processes.

The inside of the vacuum transfer chamber 200 is depressurized to a predetermined vacuum atmosphere. The vacuum transfer chamber 200 is provided with a transfer mechanism 201 capable of transferring the wafer W in a depressurized state. The transfer mechanism 201 transfers the wafer W to the processing devices 101 to 104 and the load lock chambers 301 to 303. The transfer mechanism 201 has, for example, two transfer arms 202a and 202b.

The load lock chambers 301 to 303 are connected to the vacuum transfer chamber 200 via gate valves G21 to G23, respectively, and are connected to the air transfer chamber 400 via gate valves G31 to G33. The inside the load lock chambers 301 to 303 may be switched between an air atmosphere and a vacuum atmosphere.

The atmosphere inside the air transfer chamber 400 is an air atmosphere. For example, a downflow of clean air is formed inside the air transfer chamber 400. In the air transfer chamber 400, an aligner 401 for aligning the wafer W is provided. Further, the air transfer chamber 400 is provided with a transfer mechanism 402. The transfer mechanism 402 transfers the wafer W to the load lock chambers 301 to 303, the carriers C of the load ports 501 to 503 described later, and the aligner 401.

The load ports 501 to 503 are provided on the wall surface of the long side of the air transfer chamber 400. A carrier C containing wafers W or an empty carrier C is attached to each of the load ports 501 to 503. As the carrier C, for example, an FOUP (Front Opening Unified Pod) may be used.

The general controller 600 controls each part of the substrate processing system. For example, the general controller 600 controls the operations of the processing devices 101 to 104, the operations of the transfer mechanisms 201 and 402, the opening and closing of the gate valves G11 to G14, G21 to G23 and G31 to G33, switching of the atmosphere in the load lock chambers 301 to 303, and the like. The general controller 600 may be, for example, a computer.

Further, the configuration of the substrate processing system is not limited to the above. The substrate processing system may be configured to include a multi-substrate processing device for processing a plurality of wafers W with one processing device. Further, the vacuum transfer chamber may also have a configuration in which the multi-substrate processing device is connected to the vacuum transfer chamber via a gate valve, or a configuration in which a plurality of vacuum transfer devices is connected to the vacuum transfer chamber.

Figure 2:
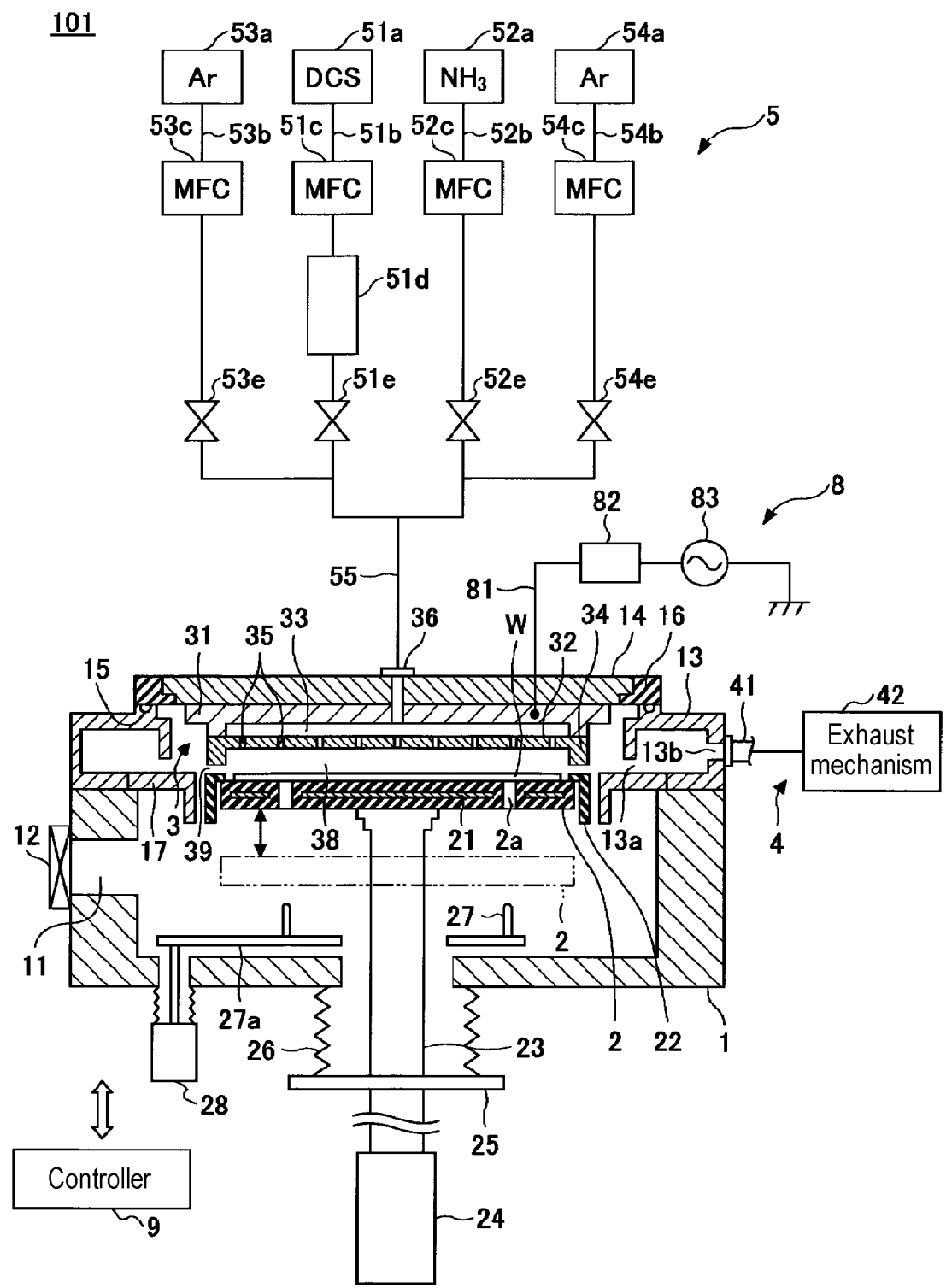
FIG. 2 is a schematic diagram showing a configuration example of a first processing device.

Next, a configuration example of the processing device 101 will be described. The processing device 101 is an example of a first processing device that forms a SiN film by a PE-ALD (Plasma Enhanced Atomic Layer Deposition) method in a processing container under a depressurized state. FIG. 2 is a schematic diagram showing a configuration example of the processing device 101.

As shown in FIG. 2, the processing device 101 includes a processing container 1, a mounting table 2, a shower head 3, an exhaust 4, a gas supply mechanism 5, an RF power supplier 8, and a controller 9.

The processing container 1 is made of a metal such as aluminum or the like and has a substantially cylindrical shape. The processing container 1 accommodates a wafer W. A loading and unloading port 11 for loading or unloading the wafer W is formed on the side wall of the processing container 1 and is opened and closed by a gate valve 12. An annular exhaust duct 13 having a rectangular cross section is provided on the main body of the processing container 1. A slit 13a is formed in the exhaust duct 13 along the inner peripheral surface. An exhaust port 13b is formed on the outer wall of the exhaust duct 13. A top wall 14 is provided on the upper surface of the exhaust duct 13 so as to close the upper opening of the processing container 1 via an insulator member 16. The gap between the exhaust duct 13 and the insulator member 16 are hermetically sealed with a seal ring 15. When the mounting table 2 (and the cover member 22) is moved up to the processing position as described later, the partition member 17 partitions the inside of the processing container 1 into upper and lower spaces.

The mounting table 2 horizontally supports the wafer W in the processing container 1. The mounting table 2 is formed in a disk shape at a size corresponding to the wafer W and is supported by a support member 23. The mounting table 2 is made of a ceramic material such as AlN or a metallic material such as aluminum or nickel alloy. A heater 21 for heating the wafer W is embedded in the mounting table 2. The heater 21 is supplied with electric power from a heater power source (not shown) to generate heat. Then, the temperature of the wafer W is controlled to a predetermined temperature by controlling the output of the heater 21 by a temperature signal of a thermocouple (not shown) provided near the upper surface of the mounting table 2. The mounting table 2 is provided with a cover member 22 made of ceramics such as alumina or the like so as to cover the outer peripheral region of the upper surface and the side surface.

A support member 23 for supporting the mounting table 2 is provided on the bottom surface of the mounting table 2. The support member 23 extends downward from the center of the bottom surface of the mounting table 2 through a hole formed in the bottom wall of the processing container 1. The lower end of the support member 23 is connected to an elevating mechanism 24. The elevating mechanism 24 causes the mounting table 2 to move up and down via the support member 23 between a processing position shown in FIG. 2 and a transfer position located below the processing position and indicated by a two-dot chain line, at which the wafer W can be transferred. A flange portion 25 is attached to the support member 23 below the processing container 1. Between the bottom surface of the processing container 1 and the flange portion 25, there is provided a bellows 26 that separates the atmosphere inside the processing container 1 from the outside air and expands and contracts as the mounting table 2 is moved up and down.

Near the bottom surface of the processing container 1, three wafer support pins 27 (only two of which are shown) are provided so as to protrude upward from the elevating plate 27a. The wafer support pins 27 are moved up and down via an elevating plate 27a by an elevating mechanism 28 provided below the processing container 1. The wafer support pins 27 are inserted into through-holes 2a provided in the mounting table 2 at the transport position so that the wafer support pins 27 can protrude and retract with respect to the upper surface of the mounting table 2. By raising and lowering the wafer support pins 27, the wafer W is delivered between the transfer mechanism (not shown) and the mounting table 2.

The shower head 3 supplies a processing gas into the processing container 1 in the form of shower. The shower head 3 is made of a metal and is provided to face the mounting table 2. The shower head 3 has substantially the same diameter as the mounting table 2. The shower head 3 includes a main body portion 31 fixed to the top wall 14 of the processing container 1 and a shower plate 32 connected to the underside of the main body portion 31. A gas diffusion space 33 is formed between the main body portion 31 and the shower plate 32. A gas introduction hole 36 leading to the gas diffusion space 33 is provided to penetrate the top wall 14 of the processing container 1 and the center of the main body portion 31. An annular protrusion 34 protruding downward is formed on the peripheral edge of the shower plate 32. Gas discharge holes 35 are formed on the flat surface inside the annular protrusion 34. When the mounting table 2 is located at the processing position, a processing space 38 is formed between the mounting table 2 and the shower plate 32, and the upper surface of the cover member 22 and the annular protrusion 34 are close to each other to form an annular gap 39.

The exhaust 4 evacuates the inside of the processing container 1. The exhaust 4 includes an exhaust pipe 41 connected to the exhaust port 13*b*, and an exhaust mechanism 42 having a vacuum pump, a pressure control valve and the like connected to the exhaust pipe 41. At the time of processing, the gas in the processing container 1 is moved to the exhaust duct 13 through the slit 13*a* and is exhausted from the exhaust duct 13 through the exhaust pipe 41 by the exhaust mechanism 42.

The gas supply mechanism 5 supplies a processing gas into the processing container 1. The gas supply mechanism 5 includes a precursor gas supply source 51*a*, a reaction gas supply source 52*a*, an Ar gas supply source 53*a*, and an Ar gas supply source 54*a*.

The precursor gas supply source 51*a* supplies a precursor gas into the processing container 1 via a gas supply line 51*b*. In the example shown in FIG. 2, a DCS (dichlorosilane) gas is used as the precursor gas. A flow rate controller 51*c*, a storage tank 51*d*, and a valve 51*e* are installed in the gas supply line 51*b* sequentially from the upstream side. The portion of the gas supply line 51*b* on the downstream side of the valve 51*e* is connected to the gas introduction hole 36 via a gas supply line 55. The precursor gas supplied from the precursor gas supply source 51*a* is temporarily stored in the storage tank 51*d* before being supplied into the processing container 1, pressurized to a predetermined pressure in the storage tank 51*d*, and then supplied into the processing container 1. The supply and cutoff of the precursor gas from the storage tank 51*d* to the processing container 1 is performed by opening and closing the valve 51*e*. By temporarily storing the precursor gas in the storage tank 51*d* in this way, it is possible to stably supply the precursor gas having a relatively large flow rate into the processing container 1.

The reaction gas supply source 52*a* supplies a reaction gas into the processing container 1 via a gas supply line 52*b*. In the example shown in FIG. 2, an $NH_3$ gas is used as the reaction gas. A flow rate controller 52*c* and a valve 52*e* are installed in the gas supply line 52*b* sequentially from the upstream side. The portion of the gas supply line 52*b* on the downstream side of the valve 52*e* is connected to the gas introduction hole 36 via the gas supply line 55. The reaction gas supplied from the reaction gas supply source 52*a* is supplied into the processing container 1. The supply and cutoff of the reaction gas to the processing container 1 is performed by opening and closing the valve 52*e*.

The Ar gas supply source 53*a* supplies an Ar gas as a purge gas into the processing container 1 via a gas supply line 53*b*. A flow rate controller 53*c* and a valve 53*e* are installed in the gas supply line 53*b* sequentially from the upstream side. The downstream side of the valve 53*e* of the gas supply line 53*b* is connected to the gas supply line 51*b*.

The Ar gas supplied from the Ar gas supply source 53*a* is supplied into the processing container 1. The supply and cutoff of the Ar gas to the processing container 1 is performed by opening and closing the valve 53*e*.

The Ar gas supply source 54*a* supplies an Ar gas as a purge gas into the processing container 1 via a gas supply line 54*b*. A flow rate controller 54*c* and a valve 54*e* are installed in the gas supply line 54*b* sequentially from the upstream side. The downstream side of the valve 54*e* of the gas supply line 54*b* is connected to the gas supply line 52*b*. The Ar gas supplied from the Ar gas supply source 54*a* is supplied into the processing container 1. The supply and cutoff of the Ar gas to the processing container 1 is performed by opening and closing of the valve 54*e*.

Further, the processing device 101 is a capacitively coupled plasma processing device in which the mounting table 2 serves as a bottom electrode and the shower head 3 serves as a top electrode. The mounting table 2 serving as the bottom electrode is grounded via a capacitor (not shown). The reactance of the bottom electrode (bottom reactance) is determined by the reciprocal of the capacitor capacity.

Radio frequency power (hereinafter also referred to as "RF power") is applied to the shower head 3 serving as the top electrode by the RF power supplier 8. The RF power supplier 8 includes a power supply line 81, a matcher 82, and a radio frequency power source 83. The radio frequency power source 83 is a power source that generates radio frequency power. The radio frequency power has a frequency suitable for plasma generation. The frequency of the radio frequency power is, for example, a frequency in the range of 450 KHz to 100 MHz. The radio frequency power source 83 is connected to the main body portion 31 of the shower head 3 via the matcher 82 and a feeding line 81. The matcher 82 has a circuit for matching the output reactance of the radio frequency power source 83 and the reactance of the load (top electrode). Although the RF power supplier 8 has been described as applying radio frequency power to the shower head 3 serving as the top electrode, the present disclosure is not limited thereto. Radio frequency power may be applied to the mounting table 2 serving as the bottom electrode.

The controller 9 is, for example, a computer, and includes a CPU (Central Processing Unit), a RAM (Random Access Memory), a ROM (Read Only Memory), an auxiliary memory device, and the like. The CPU operates based on a program stored in the ROM or the auxiliary memory device and controls the operation of the processing device 101. The controller 9 may be provided inside the processing device 101 or may be provided outside the processing device 101. When the controller 9 is provided outside the processing device 101, the controller 9 can control the processing device 101 through a communication means such as a wired communication means or a wireless communication means.

Figure 3:
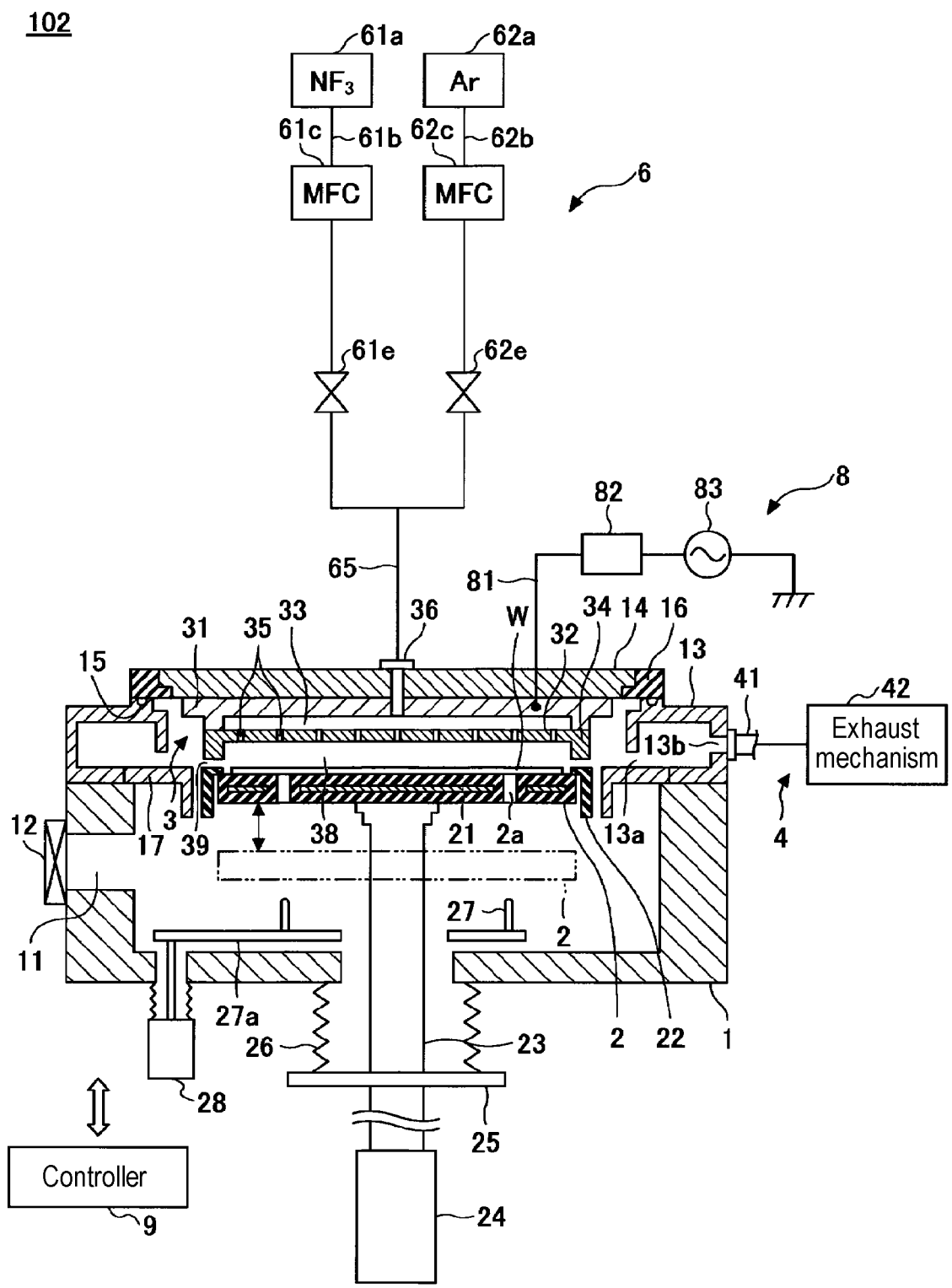
FIG. 3 is a schematic diagram showing a configuration example of a second processing device.

Next, a configuration example of the processing device 102 will be described. The processing device 102 is an example of a second processing device that performs an etching process. FIG. 3 is a schematic configuration showing a configuration example of the processing device 102.

The processing device 102 shown in FIG. 3 is different from the processing device 101 shown in FIG. 2 in that it includes a gas supply mechanism 6 instead of the gas supply mechanism 5. Since other points are the same as those of the processing device 101, duplicate descriptions thereof will be omitted and the points different from the processing device 101 will be mainly described.

The gas supply mechanism 6 supplies a processing gas into the processing container 1. The gas supply mechanism 6 includes an etching gas supply source 61a and an Ar gas supply source 62a.

The etching gas supply source 61a supplies an etching gas into the processing container 1 via a gas supply line 61b. In the example shown in FIG. 3, an $NF_3$ gas is used as the etching gas. A flow rate controller 61c and a valve 61e are installed in the gas supply line 61b sequentially from the upstream side. The portion of the gas supply line 61b on the downstream side of the valve 61e is connected to the gas introduction hole 36 via a gas supply line 65. The $NF_3$ gas supplied from the etching gas supply source 61a is supplied into the processing container 1. The supply and cutoff of the $NF_3$ gas to the processing container 1 is performed by opening and closing the valve 61e.

The Ar gas supply source 62a supplies an Ar gas into the processing container 1 via a gas supply line 62b. A flow rate controller 62c and a valve 62e are installed in the gas supply line 62b sequentially from the upstream side. The portion of the gas supply line 62b on the downstream side of the valve 62e is connected to the gas introduction hole 36 via the gas supply line 65. The Ar gas supplied from the Ar gas supply source 62a is supplied into the processing container 1. The supply and cutoff of the Ar gas to the processing container 1 is performed by opening and closing the valve 62e.

Next, a configuration example of the processing device 103 will be described. The processing device 103 is an example of a third processing device that forms a SiN film by a PE-ALD method in a processing container in a depressurized state. The configuration of the processing device 103 has the same configuration as that of the processing device 101 shown in FIG. 2. Therefore, duplicate descriptions thereof will be omitted.

Figure 4:
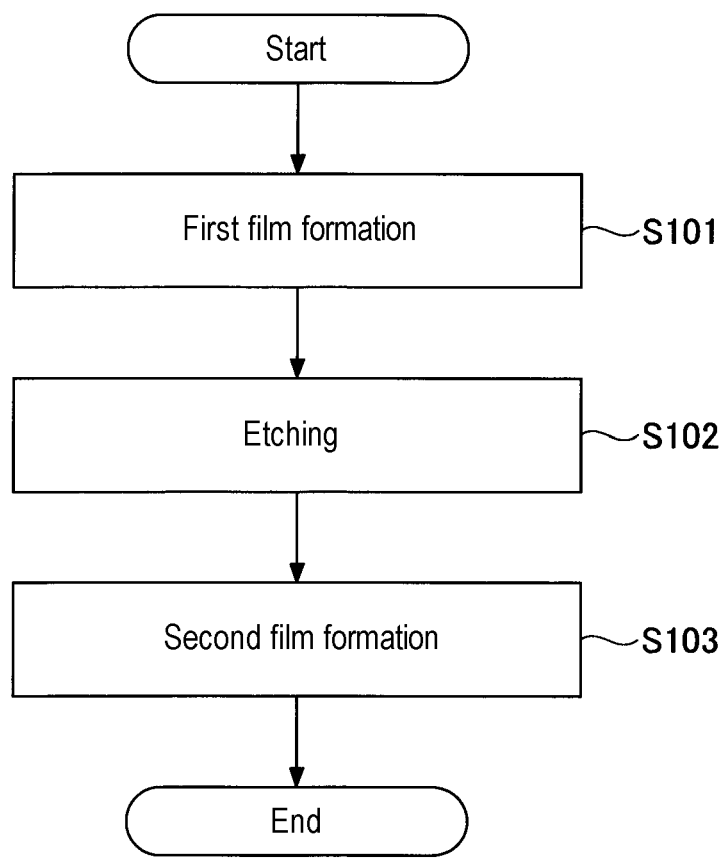
FIG. 4 is a flowchart showing an example of a substrate processing process performed by the substrate processing system.

Next, an example of a substrate processing process performed by the substrate processing system shown in FIG. 1 will be described. FIG. 4 is a flowchart showing an example of a substrate processing process performed by the substrate processing system. The substrate processing system embeds a SiN film in a wafer W on which a recess such as a trench or the like is formed.

In step S101, a SiN film is formed on a wafer W on which a recess such as a trench or the like is formed (first film formation). This step is performed by, for example, the processing device 101.

Figure 5:
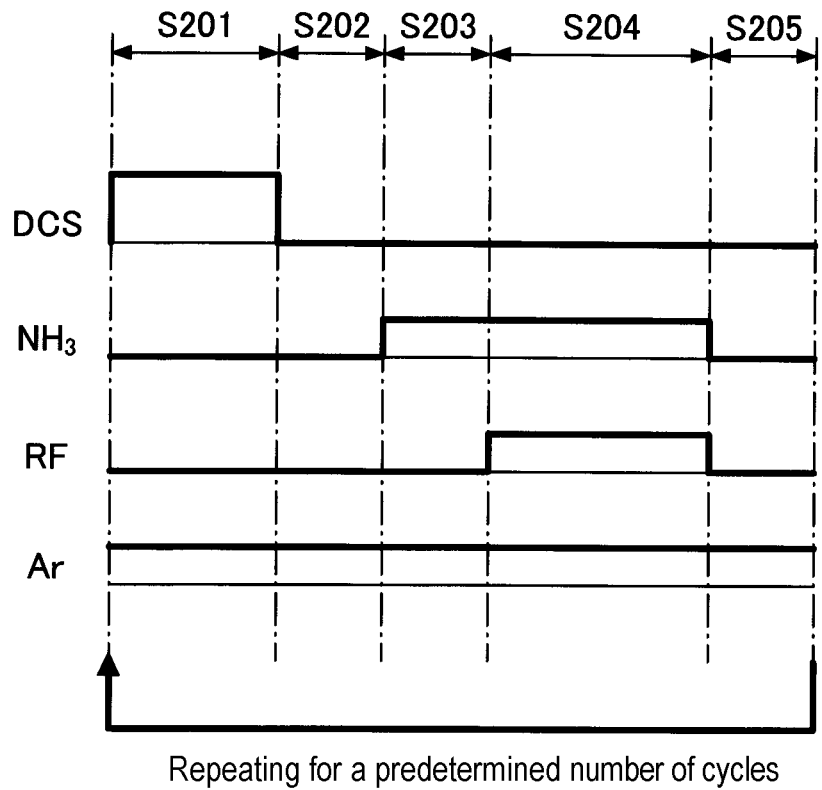
FIG. 5 is a time chart showing an example of an operation performed in the first processing device.

An example of the operation of the processing device 101 will be described with reference to FIG. 5 by taking, as an example, a case where a SiN film is formed by a PE-ALD process. FIG. 5 is a time chart showing an example of the operation performed in the first processing device 101.

The PE-ALD process shown in FIG. 5 is a process in which a SiN film having a predetermined film thickness is formed on a wafer W by repeating a precursor gas supply step S201, a purging step S202, a reaction gas supply step S203, a RF power application step S204 and a purging step S205 by a predetermined number of cycles and alternately supplying a precursor gas and a reaction gas. In FIG. 5, there is shown only one cycle.

The precursor gas supply step S201 is a step of supplying a precursor gas to the processing space 38. In the precursor gas supply step S201, first, an Ar gas is supplied from the Ar gas supply sources 53a and 54a via the gas supply lines 53b and 54b with the valves 53e and 54e kept in an open state. Further, by opening the valve 51e, a precursor gas is supplied from the precursor gas supply source 51a to the processing space 38 in the processing container 1 via the gas supply line 51b. At this time, the precursor gas is once stored in the storage tank 51d and then supplied into the processing container 1. As a result, a precursor is adsorbed on the surface of the wafer W, and an adsorption layer of the precursor is formed on the surface of the wafer W.

The purging step S202 is a step of purging an excess of a precursor gas or the like in the processing space 38. In the purging step S202, the valve 51e is closed and the supply of the precursor gas is stopped while continuously supplying the Ar gas through the gas supply lines 53b and 54b. As a result, the Ar gas is supplied from the Ar gas supply sources 53a and 54a to the processing space 38 in the processing container 1 via the gas supply lines 53b and 54b. As a result, the excess of the precursor gas or the like in the processing space 38 is purged. Further, by closing the valve 51e, the storage tank 51d is filled with the precursor gas.

The reaction gas supply step S203 is a step of supplying an $NH_3$ gas as a reaction gas. In the reaction gas supply step S203, the valve 52e is opened while continuously supplying the Ar gas through the gas supply lines 53b and 54b. As a result, the reaction gas is supplied from the reaction gas supply source 52a to the processing space 38 via the gas supply line 52b.

The RF power supply step S204 is a step of plasma-exciting the $NH_3$ gas supplied as the reaction gas. In the RF power supply step S204, plasma is generated in the processing space 38 by applying RF power to the top electrode with the radio frequency power source 83 while continuously supplying the Ar gas via the gas supply lines 53b and 54b and supplying the reaction gas via the gas supply line 52b. As a result, the adsorption layer on the surface of the wafer W is nitrided to form a SiN film.

The purging step S205 is a step of purging an excess of a reaction gas or the like in the processing space 38. In the purging step S205, the valve 52e is closed to stop the supply of the reaction gas while continuously supplying the Ar gas through the gas supply lines 53b and 54b. Further, the radio frequency power source 83 stops applying the RF power to the top electrode. As a result, the Ar gas is supplied from the Ar gas supply sources 53a and 54a to the processing space 38 in the processing container 1 via the gas supply lines 53b and 54b. Thus, the excess of the reaction gas or the like in the processing space 38 is purged.

By repeating the above cycle, a SiN film is formed on the wafer W.

Now, the preferable range of the film-forming condition for forming the SiN film using the DCS gas and the $NH_3$ gas in step S101 is shown below.

Temperature: 250 to 600 degrees C.
Pressure: 0.5 to 10 Torr
DCS gas flow rate: 10 to 100 cc/cycle
$NH_3$ gas flow rate: 500 to 10000 sccm
Ar gas flow rate: 500 to 10000 sccm
Time for step S201: 0.05 to 2.0 seconds
Time for step S202: 0.1 to 2.0 seconds
Time for step S203: 0.5 to 2.0 seconds
Time for step S204: 1.0 to 6.0 seconds
Time for step S205: 0.1 to 2.0 seconds
RF power: 50 to 1000 W
Bottom reactance: −300 to 100 Ω

Returning to FIG. 4, in step S102, the SiN film formed on the wafer W is etched (etching). This step is performed by, for example, the processing device 102.

Figure 6:
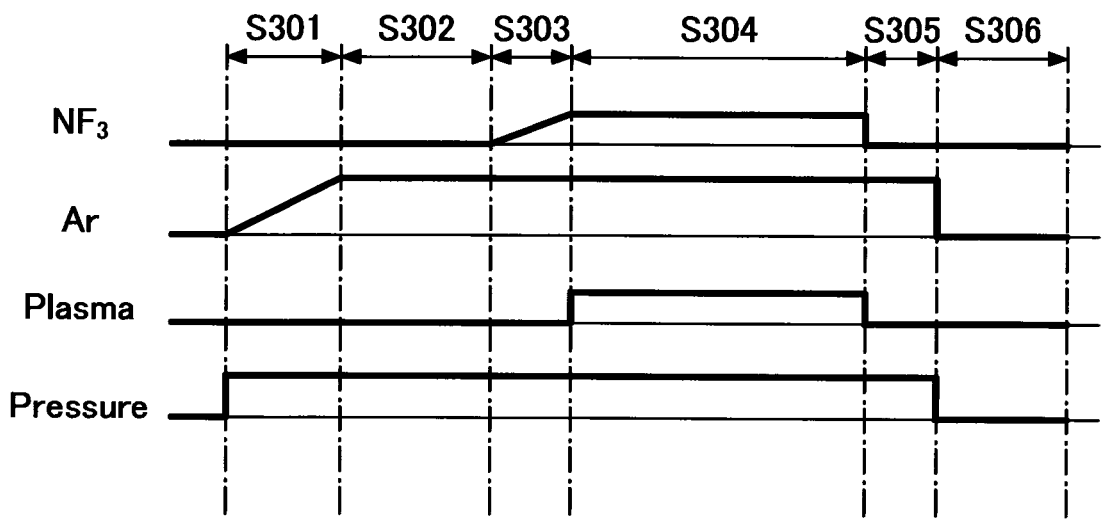
FIG. 6 is a time chart showing an example of an operation performed in the second processing device.

An example of the operation of the processing device 102 will be described with reference to FIG. 6 by taking, as an example, a case where an etching process is performed. FIG. 6 is a time chart showing an example of the operation in the second processing device 102.

The etching process shown in FIG. 6 includes a gas lamp step S301, a gas stabilization step S302, an NF$_3$ gas supply step S303, an etching step S304, an NF$_3$ gas cutoff step S305, and a purging step S306.

In the gas lamp step S301, by opening the valve 62e, an Ar gas is supplied from the Ar gas supply source 62a to the processing space 38 in the processing container 1 via the gas supply line 62b.

The gas stabilization step S302 stabilizes the Ar gas supplied to the processing space 38 while continuously supplying the Ar gas via the gas supply line 62b.

In the NF$_3$ gas supply step S303, an NF$_3$ gas is supplied from the etching gas supply source 61a to the processing space 38 in the processing container 1 through the gas supply line 61b by opening the valve 61e while continuously supplying the Ar gas through the gas supply line 62b.

In the etching step S304, RF power is applied to the top electrode by the radio frequency power source 83 to generate plasma in the processing space 38 while continuously supplying the Ar gas via the gas supply line 62b and supplying the NF$_3$ gas via the gas supply line 61b. As a result, the SiN film on the wafer W is etched.

In the NF$_3$ gas cutoff step S305, the valve 61e is closed to stop the supply of the NF$_3$ gas while continuously supplying the Ar gas through the gas supply line 62b. Further, the radio frequency power source 83 stops applying the RF power to the top electrode. As a result, the NF$_3$ gas in the processing space 38 is exhausted to the exhaust 4.

In the purging step S306, the valve 62e is closed to stop the supply of the Ar gas. As a result, the gas in the processing space 38 is exhausted to the exhaust 4, and the pressure in the processing space 38 is reduced.

By performing the above process, the SiN film formed on the wafer W is etched. Thus, as shown in FIG. 8B described later, the SiN film can be made to have a V-shaped opening.

Now, the preferable range of the etching process condition in step S102 is shown below.

Temperature: 100 to 600 degrees C.
Pressure: 0.5 to 10.0 Torr
NF$_3$ gas flow rate: 5 to 500 sccm
Ar gas flow rate: 1000 to 10000 sccm
Time for step S301: 0.0 to 10.0 seconds
Time for step S302: 0.0 to 60.0 seconds
Time for step S303: 0.5 to 10.0 seconds
Time for step S305: 0.0 to 60.0 seconds
Time for step S306: 0.0 to 60.0 seconds
RF power: 10 to 500 W Steps S301 and S302 may be omitted, and either one of S305 and S306 may be omitted.

Returning to FIG. 4, in step S103, a SiN film is formed on the etched wafer W. This step is performed by, for example, the processing device 103. The film-forming process performed in the processing device 103 is the same as that performed in the processing device 101 in step S101, and duplicate descriptions will be omitted. Thus, as shown in FIG. 8C described later, the SiN film can be embedded to have a V-shaped opening.

Now, the preferable range of the film-forming condition for forming the SiN film using the DCS gas and the NH$_3$ gas in step S103 is shown below.

Temperature: 250 to 600 degrees C.
Pressure: 0.5 to 10.0 Torr
DCS gas flow rate: 10 to 100 cc/cycle
NH$_3$ gas flow rate: 500 to 10000 sccm
Ar gas flow rate: 500 to 10000 sccm
Time for step S201: 0.05 to 2.0 seconds
Time for step S202: 0.1 to 2.0 seconds
Time for step S203: 0.5 to 2.0 seconds
Time for step S204: 1.0 to 6.0 seconds
Time for step S205: 0.1 to 2.0 seconds
RF power: 50 to 1000 W
Bottom reactance: −300 to 100 Ω

Although the description has been made assuming that the SiN film is formed in the film formation, the etching, and the film formation, the present disclosure is not limited thereto. A modifying process or the like may be interposed between the respective steps. Further, the etching and the film formation may be repeated a plurality of times to process the wafer W. In addition, a surface modifying process may be performed as a pretreatment, and an annealing process may be performed as a post-treatment.

Figure 7A:
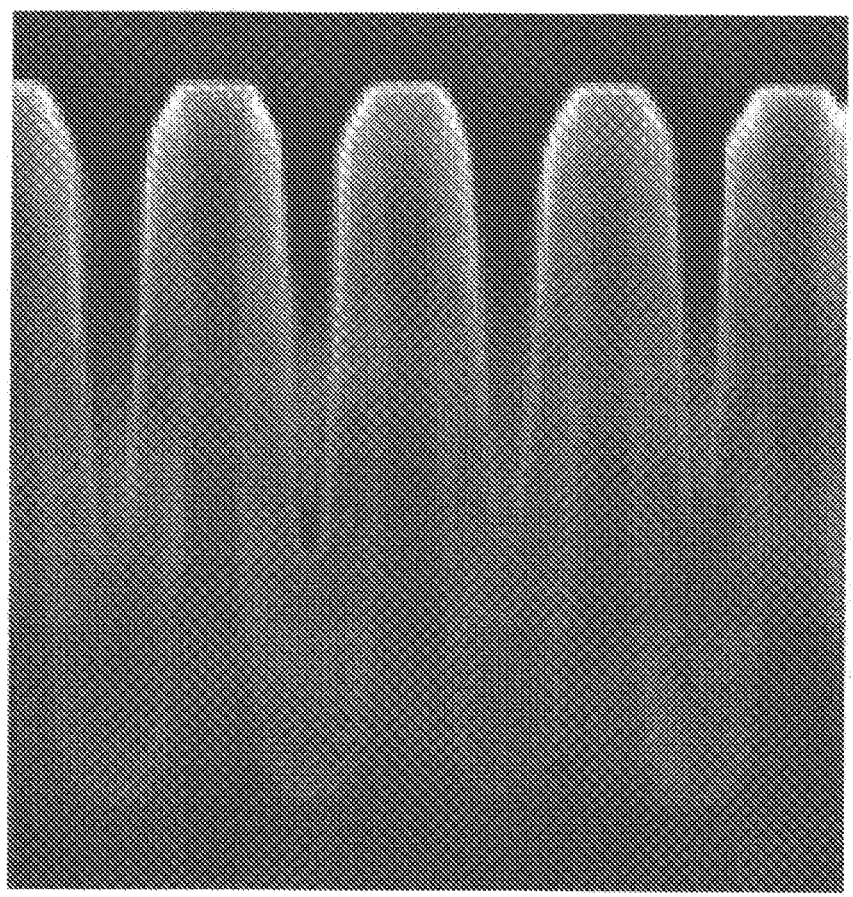
FIG. 7A is an example of a cross-sectional view of a wafer which has been subject to a first film formation and an etching.
Figure 7B:
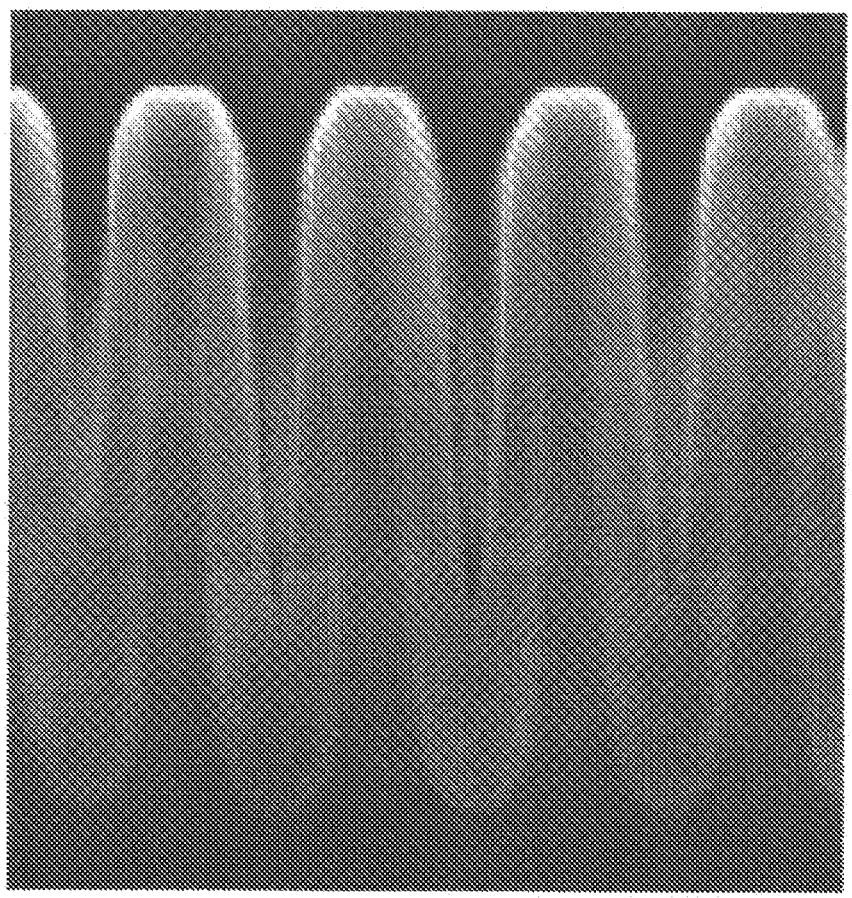
FIG. 7B is another example of a cross-sectional view of a wafer which has been subject to a first film formation and an etching.
Figure 7C:
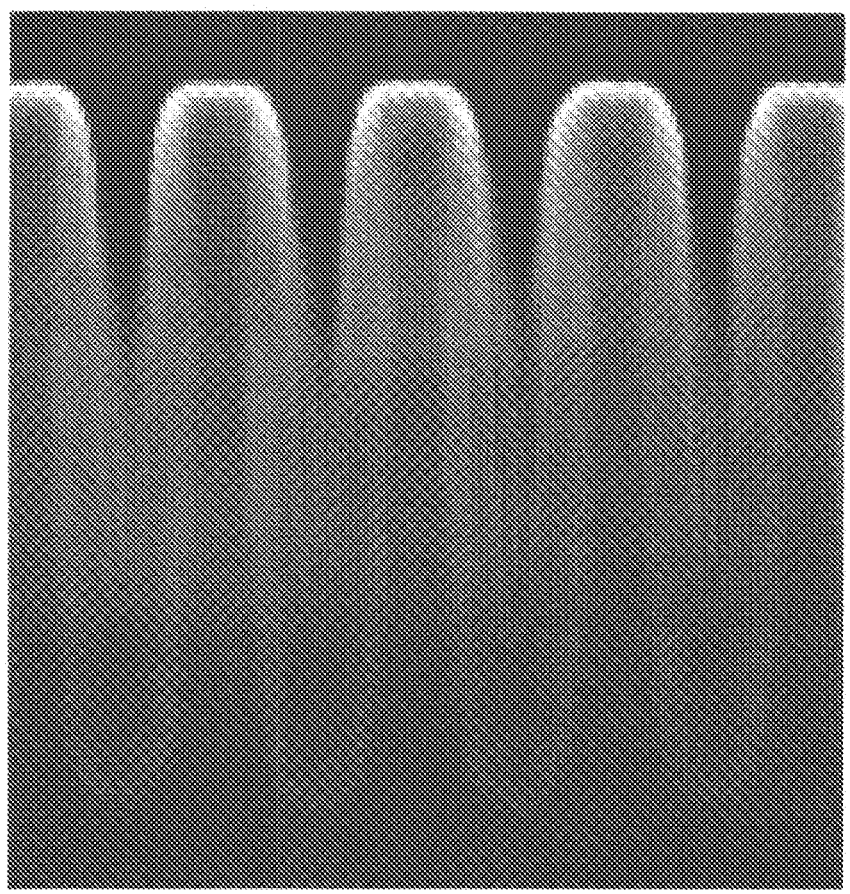
FIG. 7C is another example of a cross-sectional view of a wafer which has been subject to a first film formation and an etching.
Figure 7D:
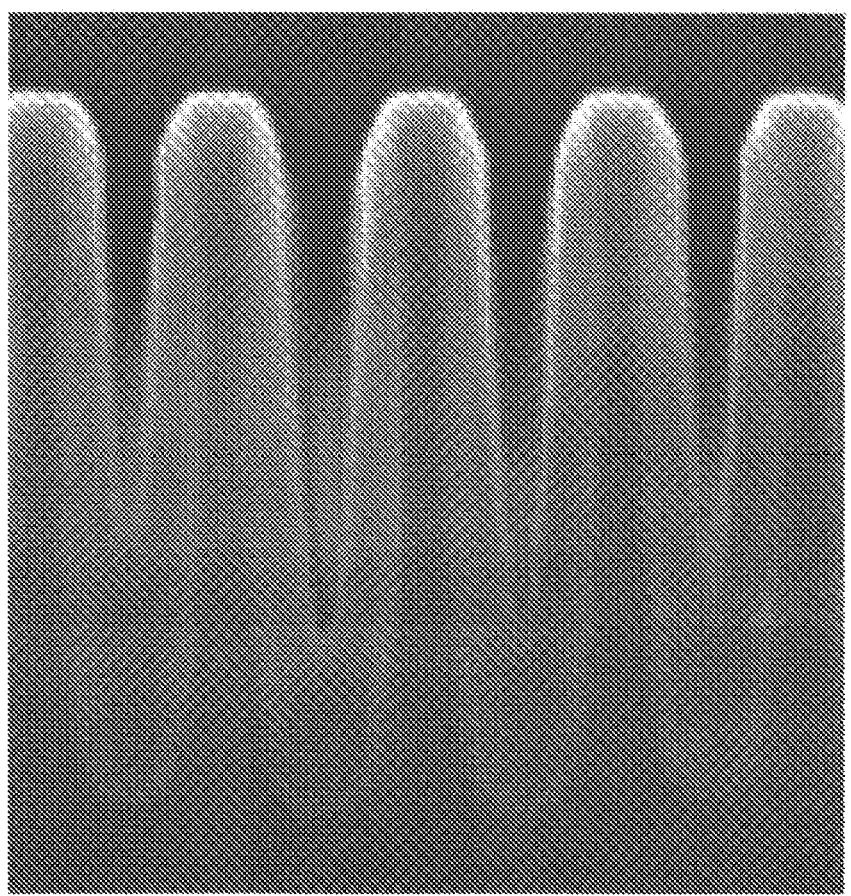
FIG. 7D is another example of a cross-sectional view of a wafer which has been subject to a first film formation and an etching.
Figure 7E:
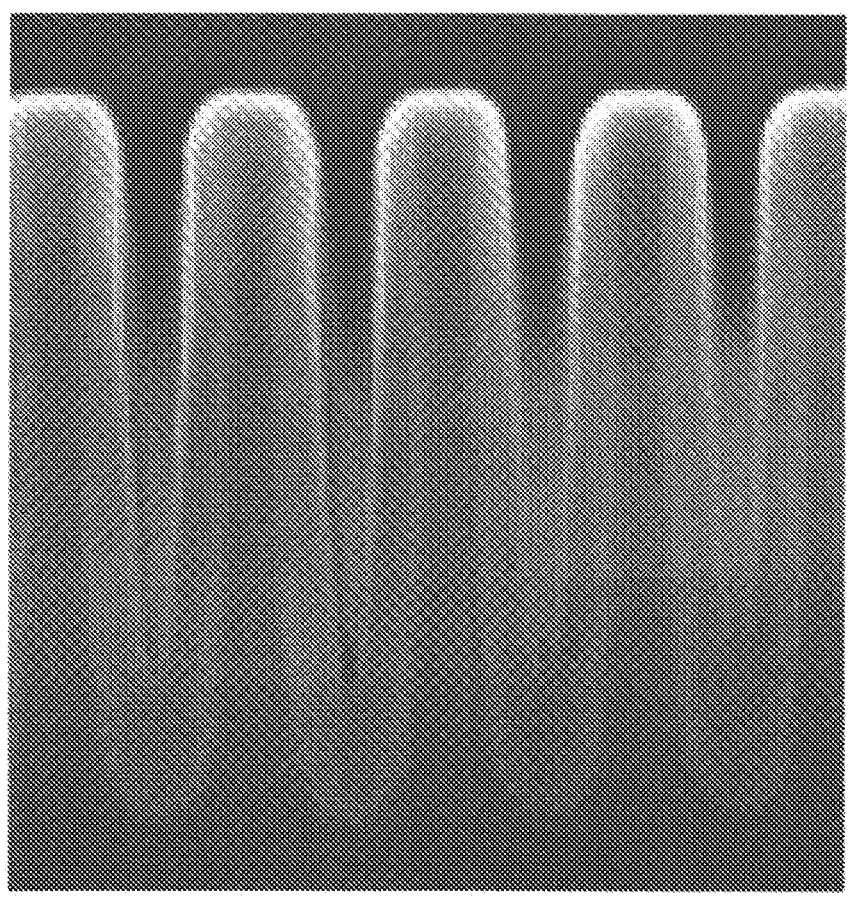
FIG. 7E is another example of a cross-sectional view of a wafer which has been subject to a first film formation and an etching.
Figure 7F:
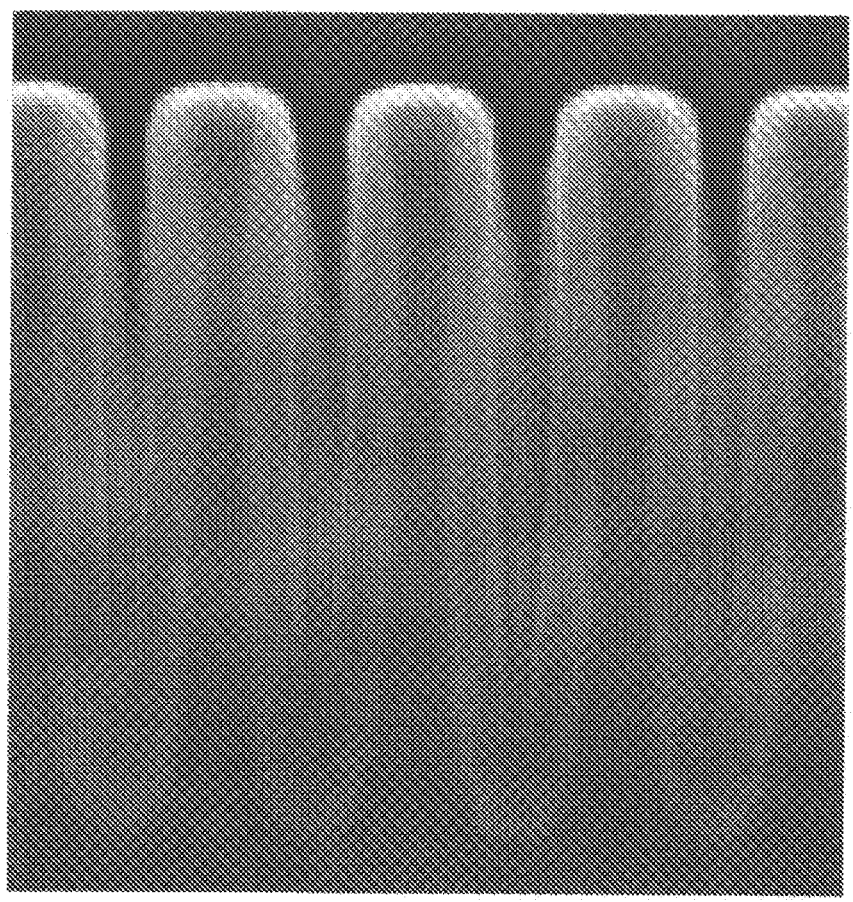
FIG. 7F is another example of a cross-sectional view of a wafer which has been subject to a first film formation and an etching.

FIGS. 7A to 7F are examples of cross-sectional views of the wafer W which has been subject to the first film formation S101 and the etching S102. The first film formation S101 and the etching S102 shown in FIG. 4 were performed on the wafer W on which a recess pattern of a trench structure is formed. Further, FIGS. 7A, 7B and 7C show the case where the reactance of the bottom electrode is −264Ω, and FIGS. 7D, 7E and 7F show the case where the reactance of the bottom electrode is −36Ω. That is, FIGS. 7A, 7B and 7C show the case where the bottom reactance is set to a low reactance, and FIGS. 7D, 7E and 7F show the case where the bottom reactance is set to a high reactance. Further, FIGS. 7A and 7D show the case where the RF power is set to 100 W, FIGS. 7B and 7E show the case where the RF power is set to 300 W, and FIGS. 7C and 7F show the case where the RF power is set to 500 W. Moreover, in FIGS. 7A to 7D, the etching S102 was subject to the same process.

In step S204 of nitriding with plasma of the first film formation S101, ions derived from NF$_3$ and Ar are incident on the SiN film. By increasing the bottom reactance, the energy of the ions derived from NF$_3$ and Ar and incident on the SiN film is increased. By reducing the bottom reactance, the energy of the ions derived from NF$_3$ and Ar and incident on the SiN film is reduced. Further, by increasing the RF power, the energy of the ions derived from NF$_3$ and Ar and incident on the SiN film is increased. By reducing the RF power, the energy of the ions derived from NF$_3$ and Ar and incident on the SiN film is reduced. As shown in FIGS. 7A to 7F, the opening shape after the etching process differs depending on the energy of the incident ions derived from NF$_3$ and Ar in step S204 of nitriding with plasma.

By setting the bottom reactance to a low reactance (reducing the capacitance of the capacitor), the SiN film can be made to have a V-shaped opening. Comparing FIGS. 7A to 7C with FIGS. 7D to 7F, it can be noted that the upper portion in FIGS. 7A to 7C has a V-shaped opening. Further, by reducing the RF power, the SiN film can be made to have a V-shaped opening. Comparing FIGS. 7A and 7D with FIGS. 7B and 7E and 7C and 7F, it can be noted that the upper portion in FIGS. 7A and 7D has a V-shaped opening.

By adjusting the process condition in the step S204 of nitriding with plasma of the first film formation S101 as described above, it is possible to control the opening shape after the etching process without changing the process condition in the etching S102.

That is, by increasing the energy of the incident ions derived from NF$_3$ and Ar in step S204 of nitriding with plasma of the first-film forming step S101, the energy of ions derived from NF$_3$ and Ar and incident on the SiN film formed on the recess shoulder portion of the trench structure (the corner portion between the upper surface of the trench structure and the side surface of the recess) is increased. This promotes the modification of the film quality of the SiN film formed on the recess shoulder portion of the trench structure and enhances the etching resistance of the SiN film formed on the recess shoulder portion. Therefore, in the etching S102, the etching of the SiN film formed on the recess shoulder portion is suppressed, and a substantially rectangular opening is formed.

On the other hand, by reducing the energy of the incident ions derived from $NF_3$ and Ar in step S204 of nitriding with plasma of the first film formation S101, the energy of ions derived from $NF_3$ and Ar and incident on the SiN film formed on the recess shoulder portion of the trench structure is reduced. As a result, the modification of the film quality of the SiN film formed on the recess shoulder portion of the trench structure is suppressed, and the etching resistance of the SiN film formed on the recess shoulder portion is reduced. Therefore, in the etching S102, the SiN film formed on the recess shoulder portion is suitably etched to form a V-shaped opening.

Figure 8A:
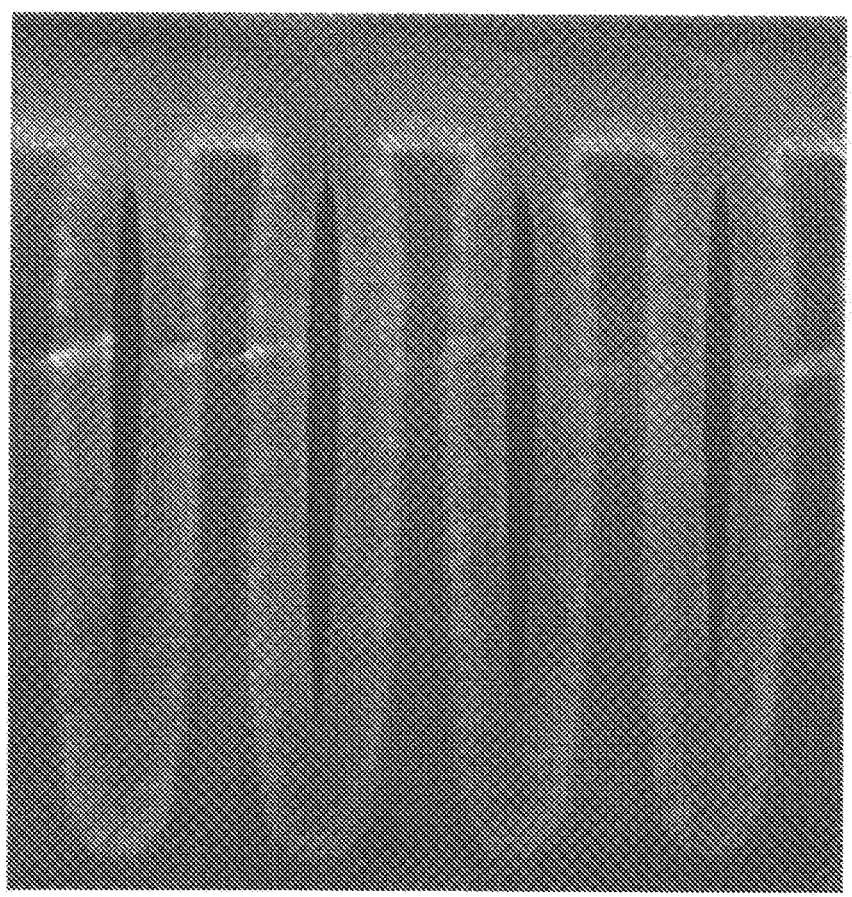
FIG. 8A is an example of a cross-sectional view of a wafer W in each state.
Figure 8B:
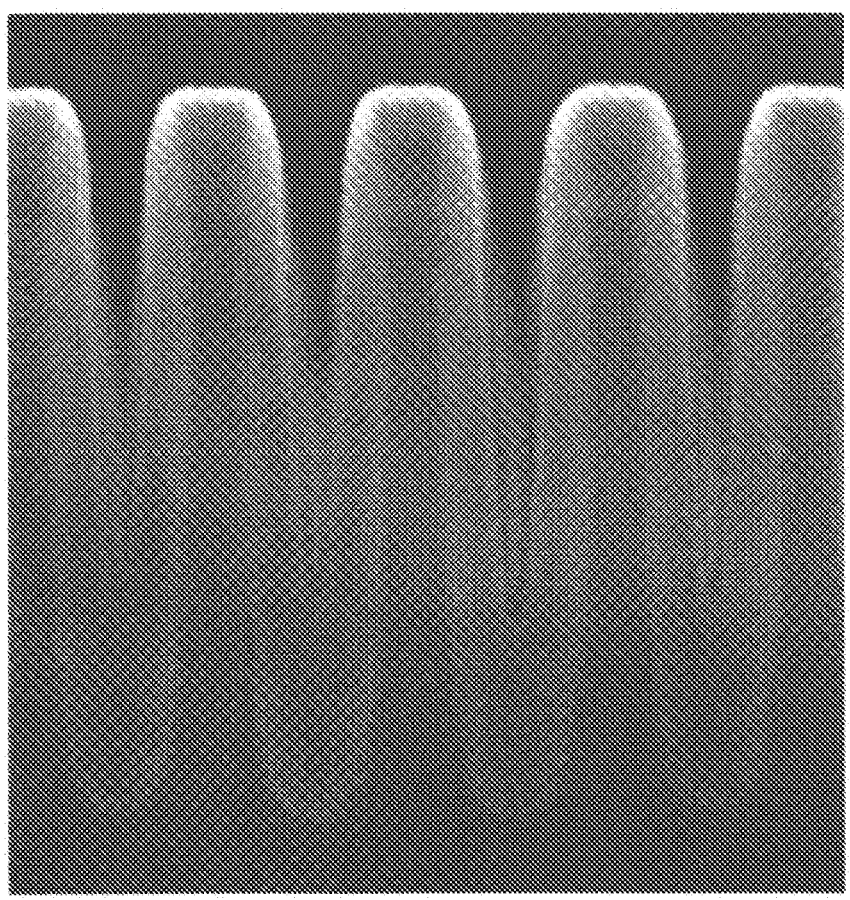
FIG. 8B is another example of a cross-sectional view of a wafer W in each state.
Figure 8C:
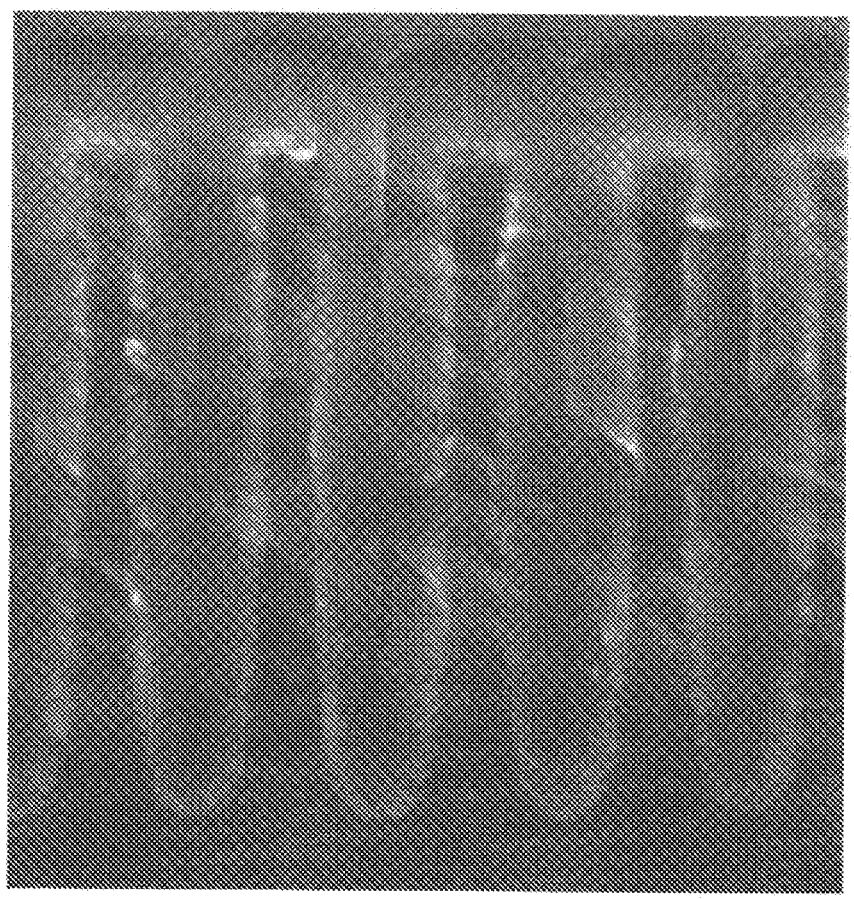
FIG. 8C is another example of a cross-sectional view of a wafer W in each state.
Figure 8D:
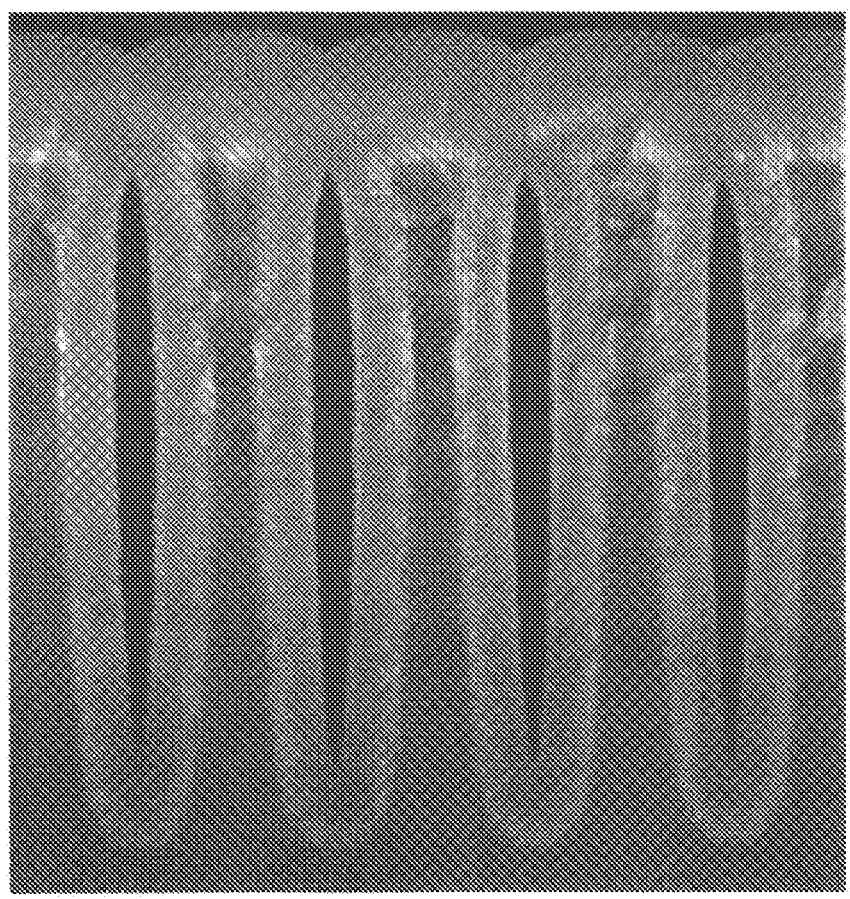
FIG. 8D is another example of a cross-sectional view of a wafer W in each state.
Figure 8E:
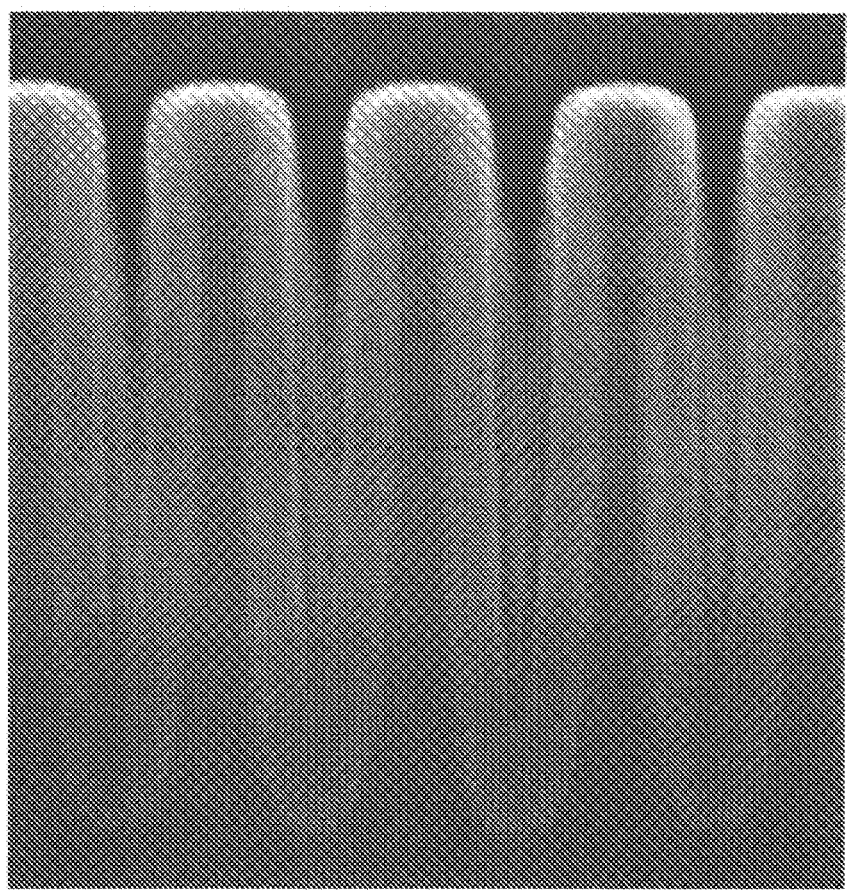
FIG. 8E is another example of a cross-sectional view of a wafer W in each state.
Figure 8F:
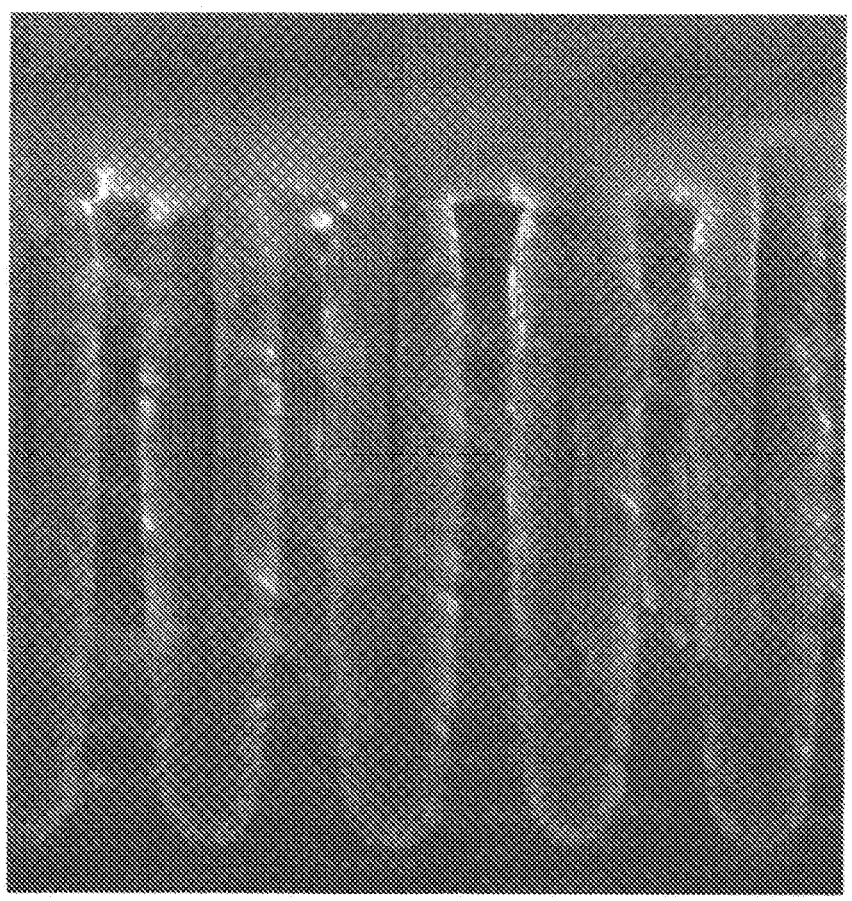
FIG. 8F is another example of a cross-sectional view of a wafer W in each state.

FIGS. 8A to 8F are examples of cross-sectional views of the wafer W in each state. The first film formation S101, the etching S102 and the second film formation S103 shown in FIG. 4 were performed on the wafer W on which a recess pattern of a trench structure is formed. FIGS. 8A and 8D show the cross section of the wafer W at the end of the first film formation S101, FIGS. 8B and 8E show the cross section of the wafer W at the end of the etching S102, and FIGS. 8C and 8F show the cross section of the wafer W at the end of the second film formation S103. Further, FIGS. 8A to 8C show a case where the energy of the incident ions derived from $NF_3$ and Ar in step S204 of the first film formation S101 is reduced (hereinafter also referred to as the present embodiment), and FIGS. 8D to 8F show a case where the energy of the incident ions derived from $NF_3$ and Ar in step S204 of the first film formation S101 is increased (hereinafter also referred to as the reference example).

As shown in FIGS. 8A and 8D, at the end of the first film formation S101, the SiN film is closed in such a form as to maintain the shape of the substrate in any case of the present embodiment and the reference example.

As shown in FIGS. 8B and 8E, the top end of the recess of the trench structure is opened at the end of the etching S102. The opening shown in FIG. 8B is a V-shaped opening which is widely opened on the opening side thereof. On the other hand, the opening shown in FIG. 8E has a shape in which the SiN film on the recess shoulder portion of the trench structure protrudes.

As shown in FIG. 8F, at the end of the second film formation S103 of the reference example, voids are formed by embedding the SiN film. On the other hand, as shown in FIG. 8C, the SiN film without voids can be embedded at the end of the second film formation S103 of the present embodiment.

As described above, according to the substrate processing system of the present embodiment, by adjusting the process condition in the first film formation S101, the opening at the end of the etching S102 can be made to have a V shape in which the opening side is widely opened. As a result, in the second film formation S103, when embedding the SiN film, it is possible to obtain good embedding characteristics and form a void-free SiN film.

Further, in the second film formation S103, the SiN film may be formed using the same process condition as in the first film formation S101.

Further, in the second film formation S103, the SiN film may be formed using a process condition different from that of the first film formation S101. Specifically, the energy of the ions derived from $NF_3$ and Ar and incident on the SiN film in step S204 of the second film formation S103 can be larger than the energy of the ions derived from $NF_3$ and Ar and incident on the SiN film in step S204 of the first film formation S101. For example, the RF power may be increased. Further, the bottom electrode may be allowed to have a high reactance. As shown in FIGS. 7A to 7F, a SiN film having high etching resistance can be obtained by using the high RF power and the high reactance. As a result, it is possible to embed a void-free SiN film and to enhance the etching resistance of the surface of the SiN film embedded in the trench structure.

Although the film-forming method of the present embodiment performed by the processing devices 101 to 103 has been described above, the present disclosure is not limited to the above-described embodiment. Various modifications and improvements may be made without departing from the scope of the gist of the present disclosure recited in the claims.

Although it has been described that the wafer is transferred to the processing devices 101 to 103 via the vacuum transfer chamber 200. However, the present disclosure is not limited thereto. The wafer may be transferred to the processing devices 101 to 103 in the air atmosphere.

Further, the first film formation S101 and the second film formation S103 may be performed by one processing device 101. In addition, the first film formation S101 to the second film formation S103 may be performed by one processing device 101.

Further, the capacitor of the bottom electrode may be a variable capacitor. This makes it possible to change the reactance of the bottom electrode in one processing device. In addition, the capacitor of the bottom electrode may be an LC circuit in which a variable coil is combined. This makes it possible to change the reactance of the bottom electrode.

Further, in the film-forming process for forming the SiN film shown in FIG. 5, the precursor may be adsorbed on the surface of the wafer W and then a modifying process may be performed. For example, the film-forming process may further include a step of generating plasma of a hydrogen-containing gas in the processing space 38 and modifying a precursor adsorption layer with hydrogen radicals. As a result, the adsorbed precursor can be modified to improve the film-forming performance. Further, in the film-forming process for forming the SiN film shown in FIG. 5, the surface of the wafer W may be nitrided and then modified. For example, the film-forming process may further include a step of generating plasma of a hydrogen-containing gas in the processing space 38 and modifying a precursor adsorption layer with hydrogen radicals. As a result, the adsorbed precursor can be modified to improve the film-forming performance.

Further, although the method of controlling the RF power and the method of controlling the bottom reactance have been described by way of example as the method of controlling the energy of the incident ions, the present disclosure is not limited thereto. For example, the energy of the incident ions may be controlled by controlling the pressure in the processing space 38. Further, the energy of the incident ions may be controlled by applying a bias to the bottom electrode. Moreover, the energy of the incident ions may be controlled by providing a DC power supplier for applying a DC (Direct Current) voltage to the bottom electrode and/or the top electrode and applying the DC voltage in a pulse. Further, the energy of the incident ions may be controlled by controlling the waveform of the applied DC voltage. In addition, the energy of the ions may be controlled by supplying radio frequency power having a TVW (Tailored Voltage Waveform) obtained by superposing different kinds of radio frequency power having a plurality of frequencies through phase control.

Although the precursor gas has been described as being a DCS gas and the reaction gas has been described as being an $NH_3$ gas, the present disclosure is not limited thereto. As the precursor gas, it may be possible to use a silicon-containing gas such as a $SiH_4$ gas, a TSA (trisilylamine) gas, a silicon-containing halide gas (silicon-based gas containing halogen), an aminosilane gas, or the like. As the reaction gas, it may be possible to use a gas such as an $NH_3$ gas, an $N_2$ gas or the like. When the $SiH_4$ gas is used as the precursor gas, the $N_2$ gas may be used as the reaction gas. Further, in the second film formation S103, the SiN film may be formed by thermal ALD without using the plasma. In this case, a gas such as an $NH_3$ gas, a hydrazine gas, a hydrazine derivative gas, or the like may be used as the reaction gas.

This application claims priority based on Japanese Patent Application No. 2019-185446 filed on Oct. 8, 2019, the entire contents of which are incorporated herein by reference.

EXPLANATION OF REFERENCE NUMERALS

101 to 104: processing device, 200: vacuum transfer chamber, W: wafer, 1: processing container, 2: mounting table, 3: shower head, 4: exhaust, 9: controller, 5, 6: gas supply mechanism, 51*a*: precursor gas supply source, 52*a*: reaction gas supply source, 53*a*: Ar gas supply source, 54*a*: Ar gas supply source, 61*a*: etching gas supply source, 62*a*: Ar gas supply source, 8: RF power supplier (radio frequency power supplier), 83: radio frequency power source

What is claimed is:

1. A substrate processing method, comprising:
    embedding a first insulating film in a recess of a substrate by repeating forming a first adsorption layer on the substrate by supplying a silicon-containing gas and causing first plasma of a reaction gas to react with the first adsorption layer by generating the first plasma of the reaction gas; and
    etching the first insulating film by generating plasma of an etching gas, and
    after the etching, embedding a second insulating film having a higher etching resistance than the first insulating film in the recess by repeating forming a second adsorption layer on the substrate by supplying the silicon-containing gas and causing second plasma of the reaction gas to react with the second adsorption layer by generating the second plasma of the reaction gas,
    wherein the causing the first plasma to react with the first adsorption layer includes controlling a shape of the first insulating film embedded in the recess after etching by controlling plasma generation parameters, and
    wherein the controlling the plasma generation parameters includes controlling energy of ions incident on the second adsorption layer in the causing the second plasma to react with the second adsorption layer in the embedding the second insulating film in the recess to be higher than the energy of ions incident on the first adsorption layer in the causing the first plasma to react with the first adsorption layer in the embedding the first insulating film in the recess.

2. The method of claim 1, wherein the plasma generation parameters include at least one of radio frequency power for generating plasma, a reactance of a bottom electrode on which the substrate is mounted, or a pressure in a processing space.

3. The method of claim 2, wherein the embedding the first insulating film in the recess further includes modifying the first adsorption layer by generating the first plasma of a hydrogen-containing gas.

4. The method of claim 3, wherein the embedding the first insulating film in the recess and the etching the first insulating film are performed without being exposed to an air atmosphere.

5. The method of claim 4, wherein the first insulating film includes at least one of a $SiO_2$ film or a SiN film.

6. The method of claim 5, wherein the silicon-containing gas includes at least one of a DCS gas, a $SiH_4$ gas, a TSA (trisilylamine) gas, a silicon-containing halide gas or an aminosilane gas.

7. The method of claim 6, wherein the reaction gas includes at least one of an $NH_3$ gas, an $N_2$ gas, a hydrazine gas or a hydrazine derivative gas.

8. The method of claim 1, wherein the embedding the first insulating film in the recess further includes modifying the first adsorption layer by generating the first plasma of a hydrogen-containing gas.

9. The method of claim 1, wherein the embedding the first insulating film in the recess and the etching the first insulating film are performed without being exposed to an air atmosphere.

10. The method of claim 1, wherein the embedding the first insulating film in the recess and the etching the first insulating film are performed in the same processing device.

11. The method of claim 1, wherein the first insulating film includes at least one of a $SiO_2$ film or a SiN film.

12. The method of claim 1, wherein the silicon-containing gas includes at least one of a DCS gas, a $SiH_4$ gas, a TSA (trisilylamine) gas, a silicon-containing halide gas or an aminosilane gas.

* * * * *